(12) United States Patent
Haywood

(10) Patent No.: US 12,340,085 B2
(45) Date of Patent: *Jun. 24, 2025

(54) DATA BUFFER FOR MEMORY DEVICES WITH UNIDIRECTIONAL PORTS

(71) Applicant: Rambus Inc., San Jose, CA (US)

(72) Inventor: Christopher Haywood, Fernandina Beach, FL (US)

(73) Assignee: RAMBUS INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/412,840

(22) Filed: Jan. 15, 2024

(65) Prior Publication Data

US 2024/0256131 A1 Aug. 1, 2024

Related U.S. Application Data

(63) Continuation of application No. 17/860,773, filed on Jul. 8, 2022, now Pat. No. 11,914,863.

(60) Provisional application No. 63/224,513, filed on Jul. 22, 2021.

(51) Int. Cl.
*G06F 3/06* (2006.01)

(52) U.S. Cl.
CPC ............ *G06F 3/061* (2013.01); *G06F 3/0659* (2013.01); *G06F 3/0673* (2013.01)

(58) Field of Classification Search
CPC ...... G06F 3/061; G06F 3/0659; G06F 3/0673; G06F 3/055; G06F 3/0656; G11C 7/1057; G11C 7/1084; G11C 7/109; G11C 5/04; G11C 11/4093
See application file for complete search history.

(56) References Cited

U.S. PATENT DOCUMENTS

| | | | |
|---|---|---|---|
| 6,807,609 B1* | 10/2004 | Lemmon | G06F 13/161 711/168 |
| 7,110,400 B2 | 9/2006 | Hronik | |
| 7,380,092 B2 | 5/2008 | Perego et al. | |
| 8,185,711 B2 | 5/2012 | Lee et al. | |
| 8,898,415 B2 | 11/2014 | Gillingham | |
| 2003/0193927 A1 | 10/2003 | Hronik | |
| 2008/0106967 A1 | 5/2008 | Oh | |
| 2012/0191943 A1 | 7/2012 | Ware | |
| 2012/0260032 A1 | 10/2012 | Chiu et al. | |

(Continued)

*Primary Examiner* — Tracy A Warren
(74) *Attorney, Agent, or Firm* — AMSEL IP LAW PLLC; Jason Amsel

(57) ABSTRACT

A serial data buffer integrated circuit comprises unidirectional host-side input and output ports, and unidirectional memory-side input and output ports. Scheduling logic generates memory device commands for writing to and reading from a memory device based on a set of host-side input packets received from a memory controller. A unidirectional serial host side input port receives host-side input packets from the memory controller. A unidirectional serial memory side output port transmits the memory device commands and the write data to the memory device based on the scheduled timing. A unidirectional serial memory side input port receives read data from the memory device in response to a read command, and a unidirectional serial host side output port transmits the read data to the memory controller within the timing constraints of the memory device.

15 Claims, 7 Drawing Sheets

(56) References Cited

U.S. PATENT DOCUMENTS

| | | | |
|---|---|---|---|
| 2014/0047155 A1* | 2/2014 | Zheng | G06F 13/4059 |
| | | | 710/310 |
| 2015/0046642 A1 | 2/2015 | Lee et al. | |
| 2016/0070483 A1 | 3/2016 | Yoon et al. | |
| 2017/0060682 A1* | 3/2017 | Kodera | G06F 11/1052 |
| 2017/0083461 A1 | 3/2017 | Desai et al. | |
| 2017/0337014 A1 | 11/2017 | Ware et al. | |
| 2020/0050396 A1 | 2/2020 | Keil | |
| 2020/0097214 A1 | 3/2020 | Zheng et al. | |
| 2022/0107753 A1 | 4/2022 | Kumar et al. | |
| 2022/0206892 A1* | 6/2022 | Imaizumi | G06F 3/061 |
| 2023/0007872 A1 | 1/2023 | Mazumder et al. | |

\* cited by examiner

| | Frame contents | |
|---|---|---|
| 0 | HDR[3] | HDR[2] |
| 1 | HDR[1] | HDR[0] |
| 2 | CID2/DDPID | CID3/R17 |
| 3 | CID0 | CID1 |
| 4 | BG1 | BG2 |
| 5 | BA1 | BG0 |
| 6 | R16 | BA0 |
| 7 | R14 | R15 |
| 8 | R12 | R13 |
| 9 | R10 | R11 |
| 10 | R8 | R9 |
| 11 | R6 | R7 |
| 12 | R4 | R5 |
| 13 | R2 | R3 |
| 14 | R0 | R1 |
| 15 | C9 | C10 |
| 16 | C7 | C8 |
| 17 | C5 | C6 |
| 18 | C3 | C4 |
| 19 | RFU | C2/RFU (BL16) |

| Downstream Frame encoding | | | | | |
|---|---|---|---|---|---|
| HDR[3] | HDR[2] | HDR[1] | HDR[0] | Command | Frame contents |
| 1 | 1 | 0 | 0 | DRAM Read | CID/BG/BA/RA/CA |
| 1 | 0 | 0 | 0 | DRAM Write | CID/BG/BA/RA/CA |
| 1 | 1 | 0 | 1 | RFU/SDB | |
| 1 | 0 | 0 | 1 | DRAM Write Pattern | CID/BG/BA/RA/CA |
| 1 | 1 | 1 | 0 | RFU/SDB | |
| 1 | 0 | 1 | 0 | Data payload (BL8/BL16L) | Write data |
| 1 | 1 | 1 | 1 | RFU/SDB | |
| 1 | 0 | 1 | 1 | Data payload (BL8/BL16H) | Write data |
| 0 | 1 | 0 | 0 | MRR | MRA |
| 0 | 0 | 0 | 0 | MRW | MRA/OP |
| 0 | 1 | 0 | 1 | RFU/SDB | |
| 0 | 0 | 0 | 1 | Refresh | ab/sb/pb |
| 0 | 1 | 1 | 0 | RFU/SDB | |
| 0 | 0 | 1 | 0 | Misc | Vref/MPC/OP |
| 0 | 1 | 1 | 1 | RFU/SDB | |
| 0 | 0 | 1 | 1 | Power control | PDE/PDX/SRE/SRX/SREF |

FIG. 5

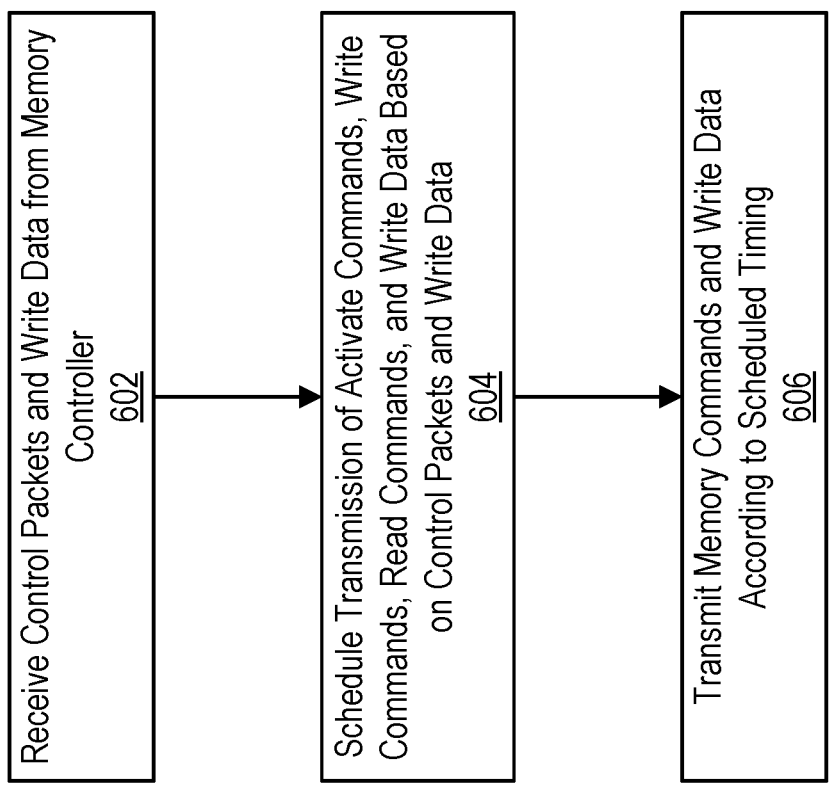

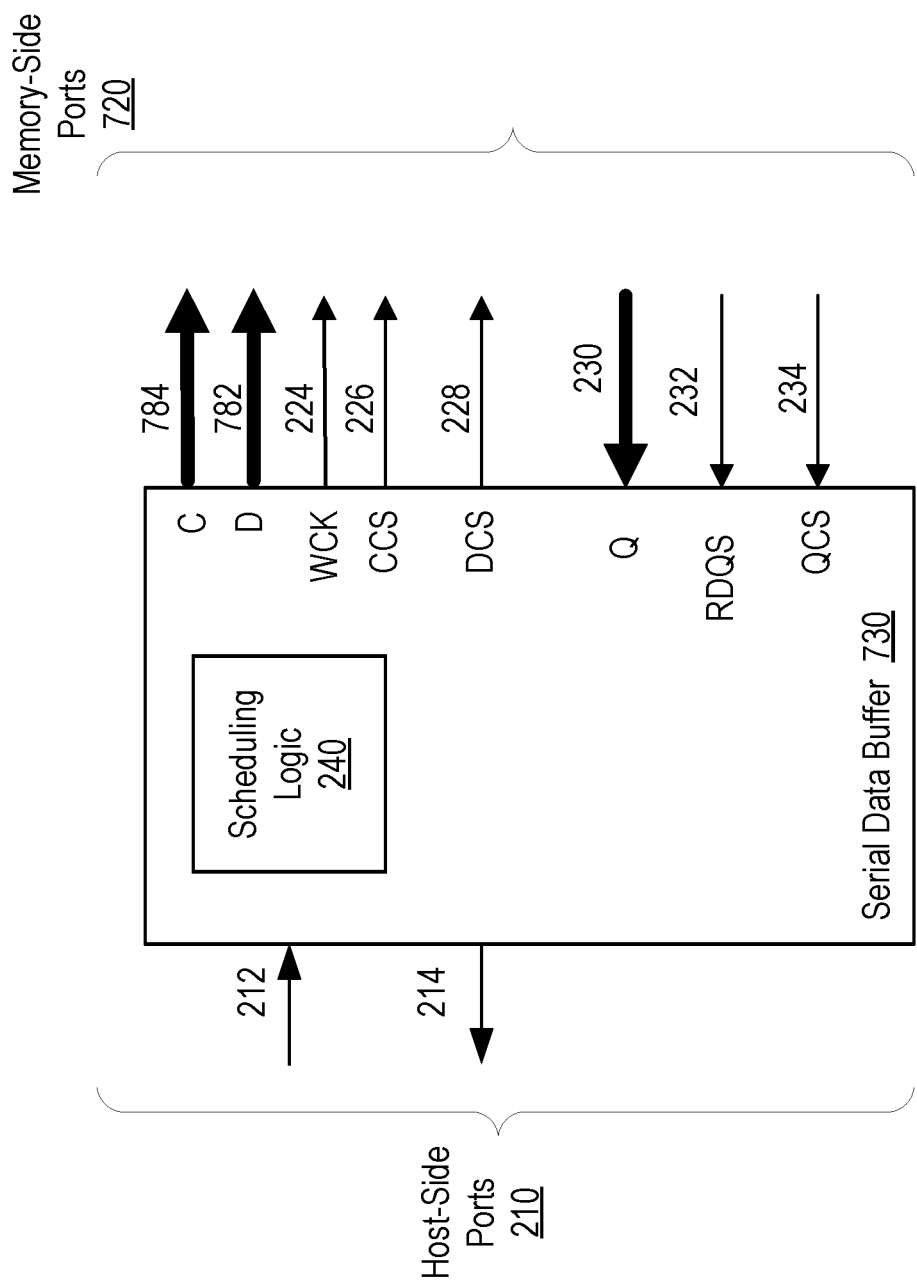

DATA BUFFER FOR MEMORY DEVICES WITH UNIDIRECTIONAL PORTS

CROSS-REFERENCE TO RELATED APPLICATIONS

This application is a continuation of U.S. patent application Ser. No. 17/860,773 filed on Jul. 8, 2022, now U.S. Pat. No. 11,914,863, which claims the benefit of U.S. Provisional Application No. 63/224,513 filed on Jul. 22, 2021, each of which are incorporated by reference herein.

BACKGROUND

A memory system includes a memory controller and a memory module having one or more memory devices. The memory controller sends commands to the memory module to facilitate writing data to the memory devices and reading data from the memory devices.

BRIEF DESCRIPTION OF THE DRAWINGS

The teachings of the embodiments herein can be readily understood by considering the following detailed description in conjunction with the accompanying drawings.

FIG. 4 is a table illustrating example host-side input packets issued by a memory controller to a serial data buffer.

FIG. 5 is a table illustrating an example encoding scheme for encoding commands in a header portion of a host-side input packet.

FIG. 6 is a flowchart illustrating an example embodiment of a process for operating a serial data buffer of a memory system.

FIG. 7 is a block diagram illustrating an alternative example embodiment of a serial data buffer for a memory system.

DETAILED DESCRIPTION

A memory system includes a serial data buffer integrated circuit that interfaces between a memory controller and a set of memory devices with unidirectional input and output ports. The serial data buffer includes scheduling logic that generates memory device commands for writing to and reading from a memory device based on a set of command packets received from the memory controller. The serial data buffer controls timing of issuing activate commands prior to read and write operations and may control the order in which commands and write data are issued to the memory devices within the timing constraints of the memory device.

Figure 1:
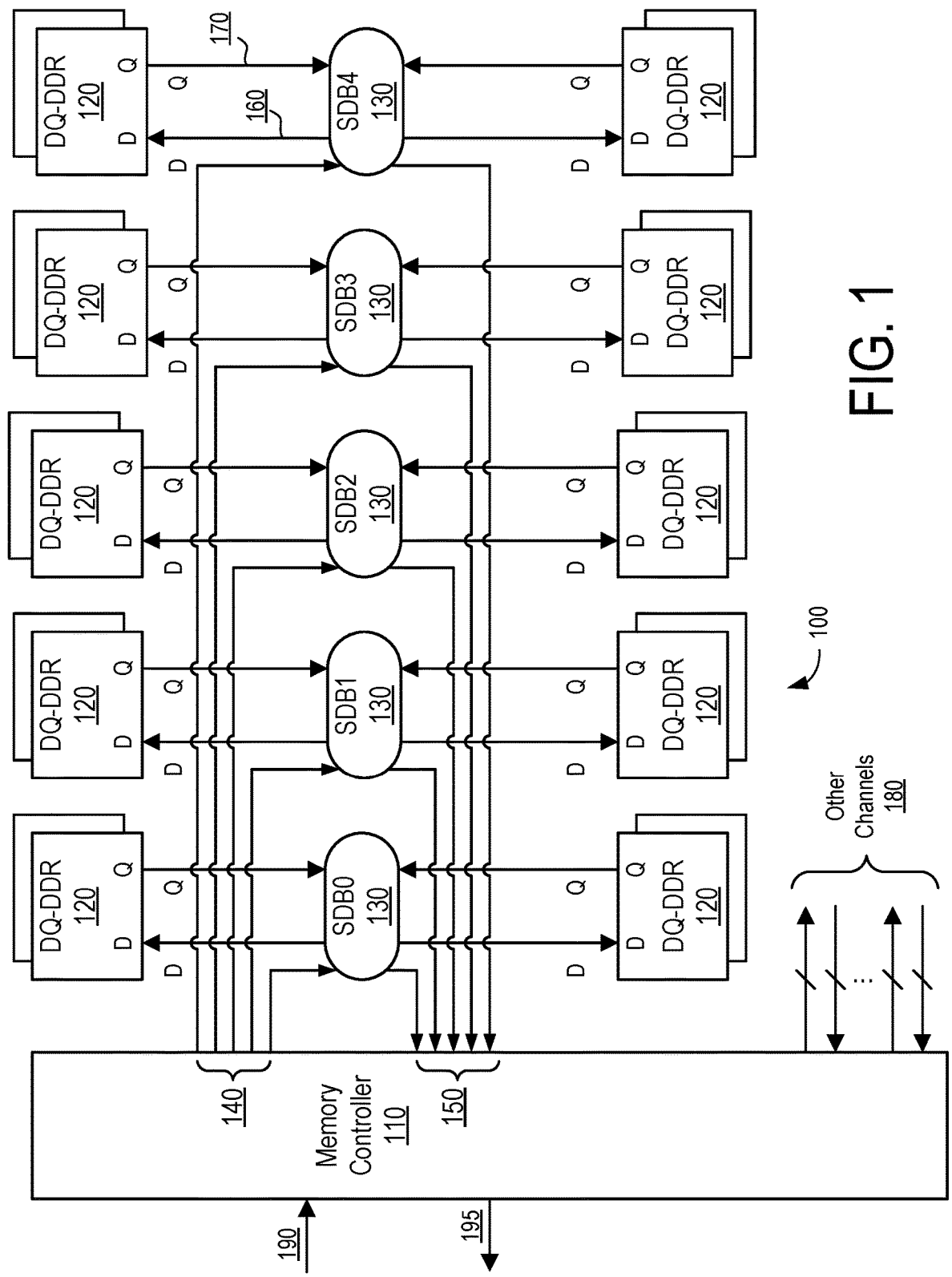
FIG. 1 is a block diagram illustrating an example embodiment of a memory system.

FIG. 1 illustrates an embodiment of a memory system 100 comprising a memory controller 110, a plurality of serial data buffers 130, and a plurality of memory devices 120. The memory controller 110 receives a set of controller input packets via one or more memory controller input lines 190 and sends host-side input packets comprising packetized commands and write data to the serial data buffers 130 via respective downstream communication lines 140. In an embodiment, the controller input packets conform to an OpenCAPI, CXL, or other similar protocol.

The serial data buffers 130 buffer and decode the host-side input packets and send commands and write data to the memory devices 120 via unidirectional serial input lines (D) 160. In response to read commands, the serial data buffers 130 read data from the memory devices 120 via unidirectional serial output lines (Q) 170, and transfer the read data (as buffer output packets) to the memory controller 110 via the upstream communication lines 150. The serial data buffer 130 controls timing and ordering of the commands and write data sent to the memory devices 120 to meet timing specifications of the memory devices 120.

In the illustrated memory system 100, the D lines 160 and Q lines 170 are shared between a plurality of memory devices 120 coupled to the same serial data buffer 130. In this configuration, the memory devices 120 are organized into ranks where only one rank is active at a time. For example, the illustrated memory system 100 comprises a memory architecture with four ranks and five memory devices 120 (and five corresponding serial data buffers 130) in each rank. Each serial data buffer 130 is coupled to one memory device 120 from each rank over the shared D lines 160 and Q lines 170. The memory controller 110 may select the active rank based on an identifier on a chip ID (CID) field received by the memory devices 120.

In alternative configurations, a different number of memory devices 120 may be coupled to each of the serial data buffers 130 (i.e., the memory system 100 may have a different number of ranks). Furthermore, the memory system 100 may include a different number of memory devices 120 in each rank and a corresponding different number of serial data buffers 130. A single memory controller 110 may similarly control additional serial data buffers 130 and memory devices 120 (not shown) via additional channels 180.

The memory devices 120 comprise DRAM (dynamic random-access memory) devices that have separate unidirectional serial input ports (D) and unidirectional serial output ports (Q) that enable the memory devices 120 to receive input commands or write data at the input port D while concurrently outputting read data on the output port Q. Each memory device 120 includes one or more memory banks that comprise an addressable memory array. For example, the memory address may be characterized by a bank address, a row address, and a column address. To execute a read or write operation associated with a particular memory address, the memory device 120 first activates a row of a memory bank by executing an activate command and then performs a column operation to read or write from the address. In a write operation, the memory device 120 furthermore receives write data following the write command and writes it to the specified memory location. In a read operation, the memory device 120 reads from the specified memory address and outputs read data via the Q line 170. The memory device 120 may furthermore perform other operations responsive to commands such as refresh operations, precharge operations, mode register read and write operations, and other memory operations.

The memory devices 120 operate with various timing constraints associated with different types of memory operations. For example, prior to a executing a read or write operation, the memory devices 120 require that the relevant row is activated (via an activate command) at least a predefined delay time prior to performing the read or write. Furthermore, the memory device 120 may be constrained to having a single row per bank activated at a given time. The memory devices 120 may also require a predefined delay to perform a read operation after data is written to the relevant location. Other timing requirement may be imposed based on the specifications of the memory devices 120.

The memory controller 110 issues host-side input packets to the serial data buffers 130 that include read and write commands, write data, or other commands such as refresh command packets, mode register set command packets, power down/exit command packets, etc. For read and write command packets, these host-side input packets lack explicit activate commands and do not encode specific timing information controlling the relative timing of activate commands, read/write commands, or other related memory operations. Thus, the host-side input packets issued from the memory controller 110 need not adhere to specific timing specifications of the memory devices 120.

The serial data buffers 130 receive the host-side input packets from the memory controller 110 and schedule memory operations for issuing to the memory devices 120 that comply with the timing specifications of the memory devices 120. In response to a command packet, the serial data buffer 130 generates and issues one or more memory device commands for carrying out the operation specified by the command packet. In some instances (e.g., for read and write command packets), the serial data buffer 130 may issue multiple memory operation commands associated with a single command packet and may control timing of the memory operation commands to meet timing specifications. For example, in response to receiving a write or read command packet (which lacks an express activate command), the serial data buffer 130 generates and issues an activate command, waits at least the activation delay time, and then issues the write or read command. In an embodiment, the serial data buffer 130 furthermore generates error correction codes associated with the write data sent to the memory devices 120.

In order to efficiently operate the memory devices 120, the serial data buffers 130 may issue the memory device commands and data in a different order than the input command packets. For example, the serial data buffer 130 may issue activate commands associated with multiple read or write command packets of a packet sequence prior to issuing the read or write command for the first command packet in the sequence. Furthermore, the serial data buffer 130 may receive a sequence of command packets and data packets, and may interleave one or more memory commands with different portions of the write data from the same data packet.

The memory controller 110, serial data buffers 130, and the memory devices 120 may include additional components that are omitted from the FIG. 1 for simplicity of illustration. In one embodiment, the memory controller 110, serial data buffers 130, and the memory device 120s may be implemented as separate dies within the same package. In other embodiments, they are implemented in their own respective packages. Furthermore, a memory module may comprise the serial data buffers 130 and memory devices 120 each implemented as respective integrated circuits mounted on a common printed circuit board.

In further embodiments, the memory system 100 may comprise a disaggregated memory system 100 in which the serial data buffers 130 and memory devices 120 are physically remote from the memory controller 110 and may be distributed at different locations.

Figure 2:
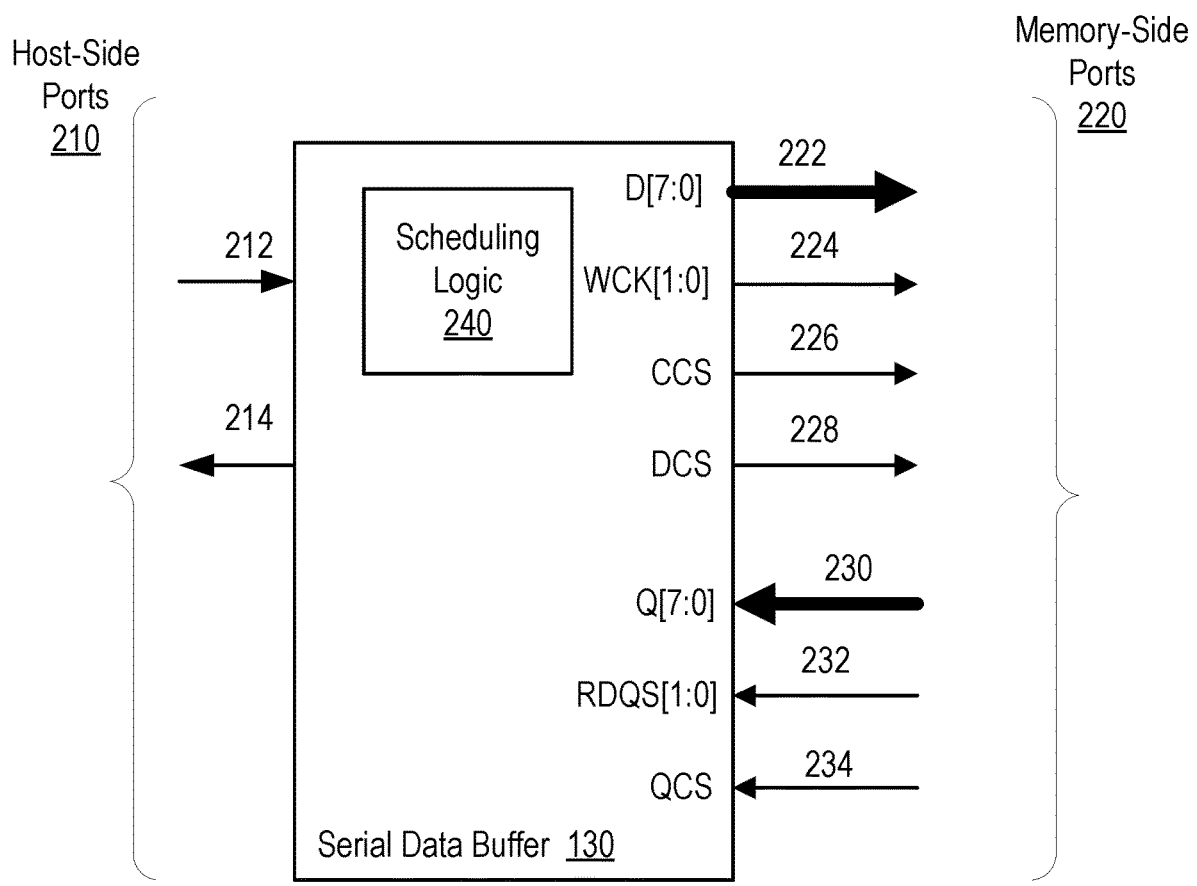
FIG. 2 is a block diagram illustrating an example embodiment of a serial data buffer for a memory system.

FIG. 2 is an example embodiment of a serial data buffer 130. The serial data buffer 130 includes host-side ports 210 for interfacing with the memory controller 110 and memory-side ports 220 for interfacing with the memory devices 120. The host-side ports 210 include one or more host-side input ports 212 for receiving host-side input packets from the memory controller 110 and one or more host-side output ports 214 for outputting read data packets to the memory controller 110. The memory-side ports 220 include the D port 222, a WCK port 224, a CCS port 226, A DCS port 228, the Q port 230, a RDQS port 232, and a QCS port 234.

The D port 222 may comprise a multi-bit port (e.g., 8 bits) for transmitting the memory device commands and write data to the memory devices 120 as described above. The WCK port 224 outputs a timing reference (e.g., a single-ended or differential clock signal) associated with commands or data transmitted on the D port 222. The CCS port 226 outputs a command enable signal indicating when the D port 222 is outputting a command. The DCS port 228 output a write data enable signal indicating when the D port 222 is outputting data.

The Q port 230 may comprise a multi-bit port (e.g., 8 bits) for transmitting read data from the memory devices 120 to the serial data buffer 130 as described above. The RDQS port 232 receives a timing reference (e.g., a single-ended or differential clock signal) associated with data received on the Q port 230 from the memory device 120. The QCS port 234 receives a read data enable signal indicating when data is being transmitted to the serial data buffer 130 on the Q port 230.

The scheduling logic 240 decodes the host-side input packets received from the memory controller 110, generates commands for sending to the memory devices 120, and schedules timing of issuing the commands and data to the appropriate memory devices 120. An example timing diagram associated with the signals is described in further detail below with respect to FIG. 3.

Figure 3:
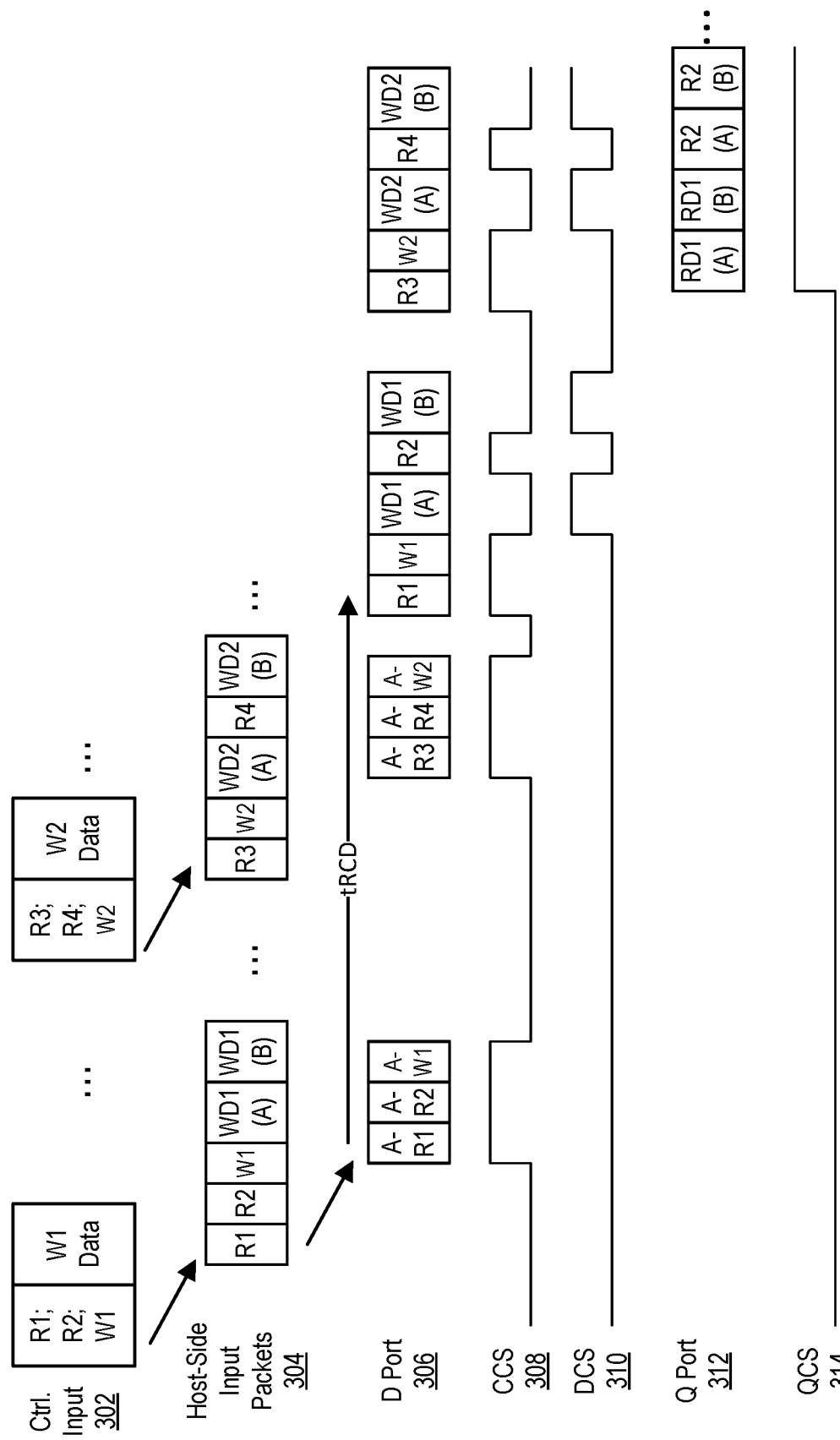
FIG. 3 is a timing diagram illustrating an example operation of a serial data buffer.

FIG. 3 is a timing diagram illustrating an example operation of the serial data buffer 130. In this example, the memory controller 110 receives a sequence of controller input packets 302 that can each encode read commands, write commands, write data, or other memory commands. In an example protocol, a controller input command packet may encode up to three commands of which one may be a write command and up to two may be read commands. Furthermore, in this example protocol, controller input data packets immediately follow a controller input command packet that includes a write command. In alternative embodiments, different controller input protocols may be use that have different constraints and/or organize commands and data differently.

Based on the controller input packets, the memory controller 110 outputs a sequence of host-side input packets 304. In an example protocol, the host-side input packets each comprise a command packet or a data packet. Here, each host-side input command packet encodes a single command (e.g., a single read command or a single write command). The host-side input data packets may each comprise a portion of the write data from a controller input packet. In the illustrated example protocol, each controller input packet is broken into a first data portion (D1) and a second data portion (D2) that are each issued as separate host-side input packets by the memory controller 110 to the serial data buffer 130. For example, a first controller input packet includes a first read command (R1), a second read command (R2), and a first write command (W1). A second controller input packet includes write data WD1 associated with the first write command (W1). In response to these controller input packets, the memory controller 110 outputs a sequence of host-side input packets including a first read command packet (R1), a second read command packet (R2), a first write command packet (W1), a first write data packet based on the first write data (WD1(A)) and a second write data packet based on the first write data (WD1(B)).

In some instances, the memory controller 110 may issue the host-side input packets 304 in a different order than received within the timing constraints of the memory device 120. For example. In the case of a second set of controller input packets (comprising read commands (R3, R4), write command (W2), and second write data (WD2)), the memory controller 110 may partially re-order the read and write operations to issue the write command (W2) and a first portion of the write data WD2(A) prior to the read command (R4). Thus, in this case, the memory controller 110 sequentially outputs the third read command (R3), the second write command (W2), a first write data packet based on the second write data (WD2(A)), the fourth read command (R4), and a second write data packet based on the second write data (WD2(B)).

The serial data buffer 130 receives the host-side input packets from the memory controller 110, buffers the host-side input packets, and issues memory requests to perform the memory operations specified in the received host-side input packets. Here, the serial data buffer 130 controls timing of the memory requests and output data to meet timing constraints and performance specifications of the memory devices 120. For read and write command packets, the serial data buffer 130 schedules timing of the activate commands associated with the relevant memory addresses, the read and write commands, the transmitting of write data to the memory device 120, and the reading of read data from the memory device 120. In some instances, the serial data buffer 130 issues buffered commands and data in a different order than received from the memory controller 110.

In the illustrated example, the serial data buffer 130 issues a first activate command (A-R1) associated with the first read command packet R1. To meet the timing specifications of the memory device 120, the serial data buffer 130 waits at least a delay time tRCD before issuing a read command R1 associated with the first read command packet R1. During this delay time tRCD, the serial data buffer 130 processes additional commands that are ready to issue. In this example, the serial data buffer 130 issues additional activate commands (A-R2, A-W1, A-R3, A-W2, A-R4) associated with the second read command packet R2, the first write command packet W1, the third read command packet R3, the second write command packet W2, and the fourth read command packet R4 respectively.

After the delay time tRCD, the serial data buffer 130 issues a sequence of commands and data all associated with the first block of controller input packets 302. Here, the serial data buffer 130 may issue the commands in a different order than received and may interleave write data and commands, within the limitations of the timing constraints. For example, in the illustrated example, the serial data buffer 130 sequentially issues the first read command R1, the first write command W1, the first portion of the first write data (WD1(A)), the second read command R2, and the second portion of the first write data (WD1(B)).

The read data becomes available on the serial data buffer input port Q 230 after respective delay time tRL following the corresponding read command. Here, the read data associated with a particular read command may be broken into multiple data words (e.g., R1(A) and R1(B) corresponding to read command R1). The read data may be packetized and sent back to the memory controller 110 (not shown).

As further illustrated in FIG. 3, select signals CCS, DCS, and QCS indicate when the serial data buffer 130 is transmitting or receiving output commands, output (write) data, or input (read) data respectively.

FIG. 4 illustrates an example embodiment of a structure for a host-side input packet for a serial data buffer. In this example, the host-side input packet includes a set of header bits (HDR) that encode the type of command together with other control and command bits. For example, for a read or write command, the host-side input packet may specify information such as the chip identifier (CID) or package identifier (DDPID), burst length (BL), and an address associated with command specified by the bank group (BG), bank address (BA), row address (R), and column address (C). The specific information encoded in the host-side input packet may vary depending on whether the host-side input packet encodes write data or a memory command and depending on the type of command.

FIG. 5 is an example embodiment of an encoding table for encoding varying types of command using the header bits of host-side input packet. In addition to read and write commands discussed above, the host-side input packet can encode other types of command such as a write pattern command, a mode register read (MRR) command, a mode register write (MRW) command, a refresh command, a power control command, or other miscellaneous commands.

FIG. 6 is a flowchart illustrating an example embodiment of a process for operating a serial data buffer 130. The serial data buffer 130 receives 602 host-side input packets from a memory controller 110 via a unidirectional host-side input port. The serial data buffer 130 then schedules 604 transmission of commands (e.g., activate commands, read commands, write commands, etc.) and write data to the memory devices 120 based on the host-side input packets. For example, the serial data buffer 130 schedules timing of activate commands prior to read and write commands, and may at least partially re-order read and write commands based on timing specifications of the memory devices 120. The serial data buffer 130 transmits 606 the commands and data to the memory devices 120 according to the scheduled timing. The serial data buffer 130 may furthermore receive 608 read data from the memory devices 120 and encode read data packets for transmitting to the memory controller 110.

FIG. 7 illustrates an alternative embodiment of a serial data buffer 730. The serial data buffer 730 is similar to the serial data buffer 130 except that the memory side ports 720 include a separate C (command) port 784 and D (data) port 782 for sending commands and data respectively from the serial data buffers 730 to the memory devices 120 instead of a shared port 222 for both commands and data. The serial data buffers 730 may communicate with memory devices (not shown) that also include separate C ports and D ports for receiving commands and data respectively. The serial data buffer 730 and other aspects of the memory system 100 may otherwise function as described above.

Upon reading this disclosure, those of ordinary skill in the art will appreciate still alternative structural and functional designs and processes for the described embodiments, through the disclosed principles of the present disclosure. Thus, while particular embodiments and applications of the present disclosure have been illustrated and described, it is to be understood that the disclosure is not limited to the precise construction and components disclosed herein. Various modifications, changes and variations which will be apparent to those skilled in the art may be made in the arrangement, operation and details of the method and apparatus of the present disclosure herein without departing from the scope of the disclosure as defined in the appended claims.

What is claimed is:

1. A data buffer device comprising:
   command scheduling logic to generate memory device commands for writing to and reading from a memory device based on command packets from a memory controller, the command scheduling logic configured to receive an input packet sequence including at least a write command packet, a first write data packet and a second write data packet associated with the write command packet, and a read command packet, and the command scheduling logic to issue to the memory device a write activate command corresponding to the write command packet and a read activate command corresponding to the read command packet, and to subsequently issue a memory device write command corresponding to the write command packet, a memory device read command corresponding to the read command packet, first write data corresponding to the first write data packet, and second write data corresponding to the second write data packet in an scheduling order in which the read command is interleaved between the first write data and the second write data;
   a host side interface to receive the command packets and the write data from the memory controller and to transmit read data to the memory controller in response to the memory device read command; and
   a memory side interface to transmit the memory device write and read commands and the first and second write data to the memory device and to receive read data from the memory device in response to the read command.

2. The data buffer device of claim 1, wherein the command scheduling logic is configured to issue the memory device write command after at least a predefined delay period following the write activate command.

3. The data buffer device of claim 1, wherein the command scheduling logic is configured to issue the memory device read command after at least a predefined delay period following the read activate command.

4. The data buffer device of claim 1, wherein following the memory device read command, the data buffer device is configured to obtain the read data from the memory device via the memory side interface and output the read data to the memory controller via the host side interface.

5. The data buffer device of claim 1, wherein the memory side interface is configured to transmit the memory device commands to the memory device concurrently with the memory side interface receiving the read data from the memory device.

6. The data buffer device of claim 1, wherein the command scheduling logic is configured to issue the read activate command associated with the read command packet at a first time, issue the write activate command associated with the write command packet at a second time following the first time, and to issue the memory device read command associated with the read command packet at a third time following the second time.

7. The data buffer device of claim 1, wherein the command scheduling logic is configured to receive a subsequent input command sequence and issue a subsequent sequence of activate commands associated with the subsequent input command sequence prior to issuing the memory device write command the memory device read command.

8. A memory module comprising:
   a first set of memory devices including at least a first memory device; and
   a first data buffer device comprising:
   command scheduling logic to generate memory device commands for writing to and reading from the first memory device based on command packets from a memory controller, the command scheduling logic configured to receive an input packet sequence including at least a write command packet, a first write data packet and a second write data packet associated with the write command packet, and a read command packet, and the command scheduling logic to issue to the memory device a write activate command corresponding to the write command packet and a read activate command corresponding to the read command packet, and to subsequently issue a memory device write command corresponding to the write command packet, a memory device read command corresponding to the read command packet, first write data corresponding to the first write data packet, and second write data corresponding to the second write data packet in an scheduling order in which the read command is interleaved between the first write data and the second write data;
   a host side interface to receive the command packets and the write data from the memory controller and to transmit read data to the memory controller in response to the read command; and
   a memory side interface to transmit the memory device write and read commands and the first and second write data to the first memory device and to receive read data from the first memory device in response to the read command; and
   first communication lines coupling the first memory device and the memory side interface of the first data buffer device.

9. The memory module of claim 8, wherein the first set of memory devices comprises:
   a second memory device coupled to the first communication lines.

10. The memory module of claim 8, further comprising:
    a second data buffer device coupled to the memory controller;
    a second set of memory devices; and
    second communication lines for transmitting data and commands from the second data buffer device to the second set of memory devices and for transmitting data from the second set of memory devices to the second data buffer device.

11. A method for operating a data buffer device, the method comprising:
    receiving, at a host side interface of the data buffer device, an input packet sequence including at least a write command packet, a first write data packet and a second write data packet associated with the write command packet, and a read command packet;
    issuing to a memory device, a write activate command corresponding to the write command packet and a read activate command corresponding to the read command packet; and
    subsequently issuing to the memory device, a memory device write command corresponding to the write command packet, a memory device read command corresponding to the read command packet, first write data corresponding to the first write data packet, and second write data corresponding to the second write data packet in an scheduling order in which the read command is interleaved between the first write data and the second write data.

12. The method of claim 11, wherein transmitting the memory device write command comprises:

transmitting the memory device write command after at least a predefined delay period following the write activate command.

13. The method of claim 11, wherein transmitting the memory device read command comprises:

transmitting the memory device read command after at least a predefined delay period following the read activate command.

14. The method of claim 11, further comprising transmitting a subsequent memory device command to the memory device concurrently with receiving read data.

15. The method of claim 11, wherein the data buffer device and the memory device are remote from a memory controller issuing the input packet sequence.

\* \* \* \* \*